(12) United States Patent
Gardner et al.

(10) Patent No.: US 6,259,133 B1
(45) Date of Patent: Jul. 10, 2001

(54) METHOD FOR FORMING AN INTEGRATED CIRCUIT MEMORY CELL AND PRODUCT THEREOF

(75) Inventors: Mark I. Gardner, Cedar Creek; Sey-Ping Sun, Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/248,432

(22) Filed: Feb. 11, 1999

(51) Int. Cl.⁷ ............ H01L 21/8247; H01L 29/788
(52) U.S. Cl. ............ 257/315; 257/347; 438/152; 438/257; 438/287
(58) Field of Search .................. 438/257–267, 438/152; 257/350, 347, 316–326, 315

(56) References Cited

U.S. PATENT DOCUMENTS

| | | |
|---|---|---|
| 5,321,286 | 6/1994 | Koyama et al. . |
| 5,633,185 * | 5/1997 | Yiu et al. ................... 438/258 |
| 5,717,233 | 2/1998 | Fujii et al. . |
| 5,742,075 | 4/1998 | Burns et al. . |
| 5,824,584 * | 10/1998 | Chen et al. ................... 438/267 |
| 5,898,189 * | 4/1999 | Gardner et al. ................... 257/661 |
| 5,969,383 * | 10/1999 | Chang et al. ................... 257/316 |
| 5,998,830 * | 12/1999 | Kwon ................... 257/315 |
| 6,025,633 * | 2/2000 | Kadosh et al. ................... 257/369 |

\* cited by examiner

Primary Examiner—Richard Booth
(74) Attorney, Agent, or Firm—Kevin L. Daffer; Conley, Rose & Tayon

(57) ABSTRACT

A method for fabricating an integrated circuit is presented. In the method, a dielectric layer is formed, and then a conductive layer is formed upon the dielectric layer. A base gate may then be patterned from the conductive layer. An intergate dielectric is preferably formed over and around the base gate. A spacer gate may then be formed such that at least a portion of the spacer gate is elevationally below an upper portion of the base gate. At least a portion of the intergate dielectric layer is preferably interposed between a sidewall surface of the spacer gate and a sidewall surface of the base gate. The final memory cell fabricated in this manner does not need to transfer electrons from a semiconducting substrate during operation.

19 Claims, 11 Drawing Sheets

METHOD FOR FORMING AN INTEGRATED CIRCUIT MEMORY CELL AND PRODUCT THEREOF

BACKGROUND OF THE INVENTION

1. Field of the Invention

This invention relates to integrated circuit fabrication and, more particularly, to a method for fabricating an integrated circuit having an improved memory cell that includes a base gate, an intergate dielectric, and a spacer gate, and to an integrated circuit capable of being manufactured by such a method.

2. Description of the Related Art

Memory circuits can be used to store and retrieve large quantities of electronic information. The term non-volatile memory is used to classify those memory circuits that are capable of retaining information when the power supply is interrupted for a substantial amount of time. Non-volatile memory can be formed using bipolar or metal oxide semiconductor ("MOS") technologies. These memory circuits are generally structured as read-only memory ("ROM"). ROMs are memories in which the data retrieval time is relatively short, but the data entry time is relatively long (if data entry is possible at all). Masked ROMs, generally referred to only as ROMs, are memories into which data is entered during manufacturing and cannot be subsequently altered. Conversely, programmable ROMs ("PROMs") allow entry of data after manufacturing is complete. Examples of MOS PROM types include erasable programmable ROM ("EPROM"), electrically erasable programmable ROM ("EEPROM"), and flash memory EEPROM ("FLASH EEPROM").

Non-volatile MOS PROMs can be fabricated using many well-known technologies such as floating gate tunnel oxide ("FLOTOX"), textured polysilicon, metal nitride oxide silicon ("MNOS"), and EPROM—tunnel oxide ("ETOX"). How each memory cell type is programmed and erased depends on the technology used. For example, a FLOTOX EEPROM memory cell is generally programmed (moving electrons into the floating gate) by biasing the control gate, and such a memory cell is generally erased (moving electrons out of the floating gate) by biasing the drain. Conversely, in MNOS memory cells charge is stored in discrete traps in the bulk of a nitride layer formed above a thin oxide layer. Programming and erasure are accomplished by inducing electron tunneling between the nitride bulk and the substrate.

FIG. 1 illustrates a FLOTOX EEPROM memory cell according to a conventional design. The FLOTOX cell includes a relatively thin tunneling oxide 102 interposed between a doped polysilicon floating gate 104 and a silicon substrate 100. Tunneling oxide 102 is typically thermally grown upon substrate 100 to a thickness of less than, for example, 100 angstroms. The FLOTOX cell further includes an interpoly oxide 106 arranged upon floating gate 104 and underlying a doped polysilicon control gate 108. Fabrication of the FLOTOX cell may involve forming these layers above silicon substrate 100 and then etching away portions of the layers not masked by a patterned photoresist layer to form the stacked structure shown in FIG. 1. A heavily concentrated dopant distribution that is self-aligned to the opposed sidewalls of the stacked structure may then be forwarded into substrate 100 to form source and drain regions 110 and 112, respectively. An oxide layer 114 may be thermally grown upon the periphery of the stacked structure and upon exposed regions of substrate 100. Due to exposure to thermal radiation during this process, the impurities within source and drain regions 110 and 112 undergo lateral migration toward the channel region underneath tunneling oxide 102, resulting in the configuration depicted in FIG. 1.

In subsequent processing, control gate 108 can be coupled to a word line conductor and bit line conductors can be formed within contact windows of oxide layer 114 for contacting drain region 112. Floating gate 104 can be programmed by grounding source and drain regions 110 and 112 and applying a relatively high voltage to control gate 108. During programming, electrons from the substrate pass through tunneling oxide 102 to floating gate 104 by a tunneling mechanism known as Fowler-Nordheim tunneling. As more electrons accumulate in floating gate 104, the electric field is reduced and the flow of electrons to floating gate 104 decreases. Programming of the memory cell is performed for a time sufficient to build up a desired charge level on the floating gate. Discharge of floating gate 104 to erase the cell can be achieved by grounding control gate 108, floating gate 104, and source region 110 and applying a relatively high voltage to drain region 112.

Because of the desire to build faster and more complex integrated circuits, it is beneficial to increase the capacitances of the memory cell dielectric layers between gates (e.g., interpoly dielectric 106) and between a gate and the substrate (e.g., tunneling oxide 102). Higher capacitances can allow, for example, the use of lower voltages to induce electron tunneling from the substrate to the floating gate. The capacitance per unit area, C, of a dielectric layer can be expressed as:

$$C = \epsilon/t$$

where $\epsilon$ is the permittivity of the dielectric layer and t is the thickness of the dielectric layer. The above equation for C demonstrates that the capacitance between two layers of conductive material separated by a dielectric is directly proportional to the permittivity of the dielectric and inversely proportional to the thickness of the dielectric.

The permittivity, $\epsilon$, of a material can be normalized to the permittivity of vacuum, $\epsilon_0$, to determine the relative permittivity of the material. Relative permittivity, or dielectric constant, k, is typically used in place of permittivity. The dielectric constant of a material is defined as:

$$k = \epsilon/\epsilon_0$$

As such, the dielectric layer thickness necessary to bring about a certain level of capacitive coupling is highly dependent on the k value of the dielectric layer. Dielectric layers with relatively low k values generally must be thinner than dielectric layers with relatively high k values to achieve similar results.

Silicon dioxide ("oxide") has a relatively low k value of less than about 4.0 (usually about 3.7 to 3.8). Consequently, a tunneling dielectric or interpoly dielectric composed of silicon dioxide may need to be made very thin (e.g., less than 100 angstroms in the case of tunneling oxides) to achieve the capacitance desired. Manufacturing reliable silicon dioxide layers at such low thicknesses, however, is difficult. As a result, thin layers of silicon dioxide often contain pinholes and/or localized voids that can adversely effect device properties.

In addition, both programming and erasure of FLOTOX EEPROM and other conventional memory cells generally involve the transfer of electrons to and from a semiconducting substrate (as described above). Such memory cells must be formed, therefore, in the substrate plane. (For the purpose of this disclosure, "substrate plane" may be considered to refer to the level of devices that are formed within, upon, or just above a substrate.) Electron transfer in these conventional memory cells often occurs between junctions (e.g., source region 110 and drain region 112) and a conductive gate (e.g., floating gate 104). The space available in the substrate plane is limited, of course, by the surface area of the substrate, and the junctions occupy valuable real estate. Furthermore, numerous non-memory devices may also need to be formed in the substrate plane. The space available in this plane for the formation of conventional memory cells, consequently, is often undesirably limited.

Therefore, it would be desirable to design a memory cell that does not need to transfer electrons between a semiconducting substrate during operation. Such a memory cell would not be required to be in the substrate plane. It would also be advantageous to incorporate dielectric layers with higher capacitances per unit area than conventionally formed silicon dioxide layers. An integrated circuit containing such a memory cell could have a higher memory density and greater reliability than conventional memory circuits.

SUMMARY OF THE INVENTION

The problems described above are in large part addressed by the method for fabricating an integrated circuit presented herein. In the present method, a dielectric layer is formed, and then a conductive layer is formed upon the dielectric layer. A base gate may then be patterned from the conductive layer. An intergate dielectric is preferably formed over and around the base gate. At least a portion of the intergate dielectric layer is preferably interposed between a sidewall surface of the base gate and a sidewall surface of a spacer gate. The final memory cell fabricated in this manner does not need to transfer electrons from a semiconducting substrate during operation. As such, an integrated circuit containing such a memory cell can have increased memory cell density relative to conventional integrated circuits.

The techniques described herein allow a memory cell to be formed in a variety of manners. For example, the memory cell can be formed in the substrate plane or in an upper level plane (i.e., a plane above the substrate plane). In this manner, the present process allows for greater flexibility in the location of memory cells than many conventional techniques. In addition, the formation of a memory cell may take place independently of or in combination with the formation of other classes of devices, such as, e.g., logic or core transistors. Combining at least a portion of the fabrication steps for devices of multiple device classes can greatly reduce fabrication time and cost.

In an embodiment, the memory cell is formed in the substrate plane. The semiconductor substrate contains a memory cell area in which the memory cell is formed. A memory cell area dielectric layer is formed upon the semiconductor substrate within the memory cell area. Then a memory cell area conductive layer may be deposited upon the memory cell area dielectric layer. The memory cell area conductive layer may be patterned to form a memory cell base gate. The memory cell area dielectric layer may be patterned to form the memory cell base gate dielectric. A memory cell intergate dielectric may then be selectively formed within the memory cell area such that it is arranged over and around the base gate. A memory cell spacer gate may then be formed such that at least a portion of the memory cell spacer gate is elevationally below an upper portion of the memory cell base gate. At least a portion of the memory cell intergate dielectric is preferably interposed between a sidewall surface of the memory cell base gate and a sidewall surface of the spacer gate.

The memory cell intergate dielectric layer preferably has an effective capacitance per unit area equivalent to a silicon dioxide layer about 15–30 angstroms thick. High k value materials, including silicon nitride and certain metal oxides (e.g., tantalum pentoxide, tungsten oxide, and titanium oxide), are beneficial in this regard because these materials can be deposited in relatively thick layers and still have an effective capacitance equivalent to a very thin silicon dioxide layer. Tantalum pentoxide, for example, has a k value of about 24—approximately 6 times that of silicon oxide. Consequently, a memory cell intergate dielectric composed of tantalum pentoxide could be about 90–180 angstroms thick to achieve the desired capacitance. The increased thickness of an intergate dielectric composed of a high k value material may result in less of the pinholes and other defects found in very thin silicon dioxide layers.

While high k value dielectric materials can be used in the intergate dielectric to achieve the desired capacitance, the present method also provides for the formation of a intergate dielectric layer composed of silicon oxynitride that can achieve similar results. Such a memory cell intergate dielectric may be formed by low-power, low-pressure PECVD using a silicon source gas and a nitrogen source gas at a deposition temperature of about 350–450° C. In a preferred embodiment, the silicon source gas is silane ($SiH_4$) and the nitrogen source gas is nitrous oxide ($N_2O$). The silane is preferably diluted such that the ratio of silane to nitrogen within the dilute silane flow is less than about 1/40 (0.025:1). Before application of RF power to the reactor chamber, a "temperature soak", or time delay to allow substrate temperature and other process conditions to stabilize, is performed. This temperature soak preferably lasts about 30–60 seconds. About 300–360 W of high frequency (about 13.56 MHz) power may then be applied to the reaction chamber to effect deposition of the intergate dielectric. The power density is preferably at most about 0.15 W/$cm^2$. The pressure within the deposition chamber is preferably less than about 2 torr. These low-power, low-pressure conditions allow for rapid stabilization of plasma conditions, allowing for the controllable deposition of an extremely thin silicon oxynitride layer. While the k value of a silicon oxynitride layer deposited in this manner may not be much higher than that of a similarly thin silicon dioxide layer, it is believed that the silicon oxynitride layer will have greater durability.

As stated above, the fabrication of the memory cell can be at least partially combined with the fabrication of other device classes. In an embodiment, the formation of the memory cell in a memory cell area of the substrate is integrated with the formation of a transistor in a transistor area of the substrate. The transistor may be formed by first forming a transistor area dielectric layer in a transistor area of a semiconductor substrate. A transistor area conductive layer is then deposited upon the transistor area dielectric layer. The transistor area conductive layer may be patterned to form a transistor gate. The transistor area dielectric layer may then be patterned to form a transistor gate dielectric layer. Subsequently, transistor spacers can be formed adjacent to opposed sidewall surfaces of the transistor gate. As will be explained in more detail below, many of these processing steps can be readily combined with similar steps in the formation of the memory cell.

While there are many benefits to combining the memory cell and transistor fabrication steps to form these devices on a single monolithic substrate, certain precautions should be taken in their design. For example, it is important that during operation the memory cell is only programmed and erased upon command. As such, the operation of other devices should not result in charging or discharging of a gate of the memory cell unless such electron transfer is desired. Preventing this problem can be problematic when different device types are formed on a single substrate, especially if the devices are close to one another.

To reduce the ability of the operation of the transistor to effect the operation and data retention of the memory cell, the dielectric layers interposed between the gates of the memory cells are preferably configured to have a composite effective capacitance per unit area greater than the effective capacitance per unit area of the transistor gate dielectric beneath the transistor gate. As such, a voltage applied simultaneously to the memory cell base gate and the transistor gate preferably induces electron tunneling between the transistor gate and the substrate before inducing electron tunneling between either memory cell gate and the substrate.

In another embodiment, the memory cell is formed in an upper level plane. The dielectric layer is formed as a dielectric base layer that is preferably 1000–5000 angstroms thick. The dielectric base layer is preferably formed above a substrate that may or may not be composed of a semiconducting material. If the substrate is composed of a semiconducting material, active devices, such as MOS transistors and memory cells as described herein, may be arranged within and upon active regions of the substrate and below the dielectric base layer. The dielectric base layer preferably provides electrical separation between any active devices formed in the substrate plane and the memory cell to be formed upon the dielectric base layer. A memory cell may be formed in an upper level plane upon the dielectric base layer in a manner similar to the embodiments described above for forming a memory cell in the substrate plane. However, as the dielectric base layer preferably provides insulation from the substrate and any active devices in the substrate plane, there may be no need to form additional dielectric layer underneath the memory cell.

As implied above, a memory cell fabricated with the techniques described herein can be programmed, read, and erased without transferring electrons between a semiconducting substrate. In an embodiment, the spacer gate may be used to store charge. Programming and erasure of the spacer gate, and thus the memory cell, can be accomplished in various ways. For example, programming of the memory cell may involve applying a positive potential to the spacer gate while grounding the base gate to induce the tunneling of electrons from the base gate to the spacer gate through the intergate dielectric. Conversely, erasure of the memory cell may involve applying a positive potential to the base gate to induce tunneling of electrons though the intergate dielectric and back to the base gate. The state of the memory cell can be read by sensing the charge of the spacer gate at a given moment in time.

Writing data to the memory cell should therefore be time multiplexed with reading data from the memory cell. In either instance, the spacer gate offers a capacitive storage area, and therefore may suffice as a word line when writing data (i.e., programming) and thereafter a bit line when reading the non-volatile, written data. Thus, the memory cell can be utilized in a set of spaced, programmable memory cells, which can be arranged in either a matrix or cross-hatched pattern or as a series of co-linear pairs of memory cells. An EPROM or EEPROM arranged in this manner would therefore employ a word-line decoder coupled to the spacer gate and base gate to selectively program a select spacer gate from among a plurality of spacer gates by applying a programming voltage to the selected spacer gate while grounding the associated base gate. Erasure can occur by word-line decoding a particular spacer gate from among the plurality (or matrix) of spacer gates, and applying a ground voltage thereto, while applying a positive voltage to the associated base gate. The programmed voltage can then be read from the selectively programmed spacer gate using a bit-line decoder. The bit-line decoder is configured to decode the selected bit-line (i.e., programmed spacer gate) at possibly a synchronized time after the spacer gate had been previously programmed.

An integrated circuit is also presented. The integrated circuit includes a dielectric layer and a memory cell at least partially arranged on the dielectric layer. The memory cell includes a memory cell base gate arranged above the dielectric layer, a memory cell intergate dielectric arranged over and around the memory cell base gate, and a memory cell spacer gate. The memory cell spacer gate is arranged such that at least a portion of the memory cell intergate dielectric is interposed between a sidewall surface of the memory cell base gate and a sidewall surface of the memory cell spacer gate. The dielectric layer may be arranged on a substrate or serve as a substrate itself. If formed on a substrate, the dielectric layer can be relatively thin so that the memory cell can be formed in the substrate plane, or a relatively thick dielectric base layer so that the memory cell can be formed in an upper level plane.

The memory cell is preferably dividable into a plurality of memory cell divided portions, each of which is capable of independently functioning as a memory cell. The memory cell can be divided by etching a portion of the memory cell such that a gap is formed between the memory cell divided portions. The gap between the memory cell divided portions should be sufficiently large to allow each portion to operate independently in a manner similar to a memory cell that is not divided. Dividing memory cell in this manner can be used to further increase the memory cell density within an integrated circuit.

BRIEF DESCRIPTION OF THE DRAWINGS

Other objects and advantages of the invention will become apparent upon reading the following detailed description and upon reference to the accompanying drawings in which:

FIG. 12 is a partial cross-sectional view of the substrate, in which the semiconductor substrate is exposed to thermal radiation according to a processing step subsequent to FIG. 11a;

Figure 1:
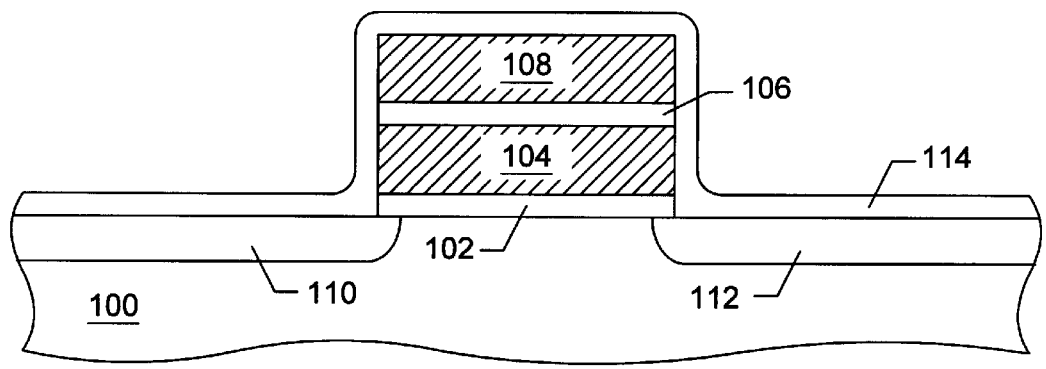
FIG. 1 is a partial cross-sectional view of a FLOTOX EEPROM memory cell according to a conventional design.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
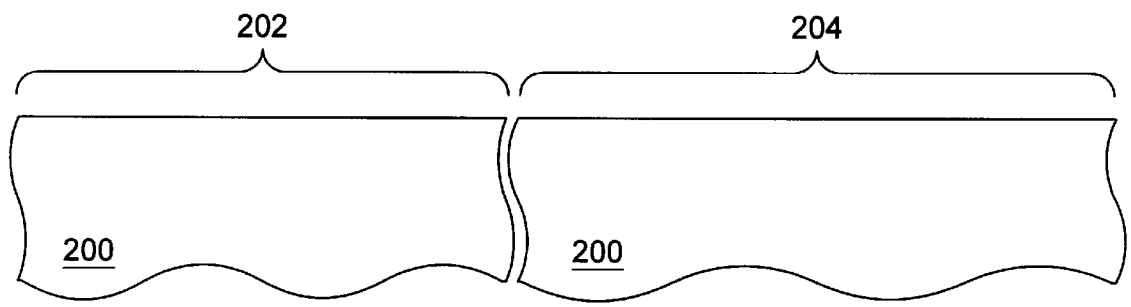
FIG. 2 is a partial cross-sectional view of a semiconductor substrate in accordance with an embodiment, in which a memory cell area and a transistor area are shown.

FIGS. 2–16 of the drawings illustrate embodiments of a process sequence for forming a memory cell. FIG. 2 presents a cross-sectional view of semiconductor substrate 200. Semiconductor substrate 200 is preferably composed of a semiconducting material, for example lightly-doped single crystal silicon. Memory cell area 202 (in which a memory cell is preferably formed) and transistor area 204 (in which a transistor is preferably formed) are also shown in FIG. 2. The portions of semiconductor substrate 200 within memory cell area 202 and transistor area 204, respectively, are depicted as disconnected in FIGS. 2–14 to emphasize the potential variability in separation between these areas. It should be understood, however, that both memory cell area 202 and transistor area 204 preferably represent regions of the topography within and above areas of a single monolithic substrate.

Memory cell area 202 is shown in FIG. 2 as being significantly smaller than transistor area 204. This potential size difference is primarily because memory cells as described within do not need to transfer electrons between the substrate during operation. Since there is no need to provide room for the space-consuming junctions often used by conventional memory cells and transistors, the memory cell of the present disclosure does not need to be much larger than the dimensions of its component parts. Consequently, the surface area of semiconductor substrate 200 within memory cell area 202 may be significantly smaller than the surface area of semiconductor substrate 200 within transistor area 204. As will be described below in relation to FIGS. 15–16, however, it may be desirable in some situations to make memory cell area 202 larger than transistor area 204. While not shown in FIGS. 2–26, isolation regions may be formed within semiconductor substrate 200 that are capable of isolating active regions such as memory cell area 202 and transistor area 204 from each other.

To facilitate the independent operation of a memory cell and a transistor formed on a single substrate, it is beneficial that the devices be configured such that operation of the transistor does not effect the memory cell unless such an effect is desired. Such a configuration is especially important if memory cell area 202 and transistor area 204 are adjacent to one another. One way to accomplish this goal is to fabricate these devices such that the effective capacitance per unit area of the dielectric materials between the memory cell gates and the substrate is greater than the effective capacitance per unit area of the dielectric materials between the transistor gate and the substrate.

Figure 3:
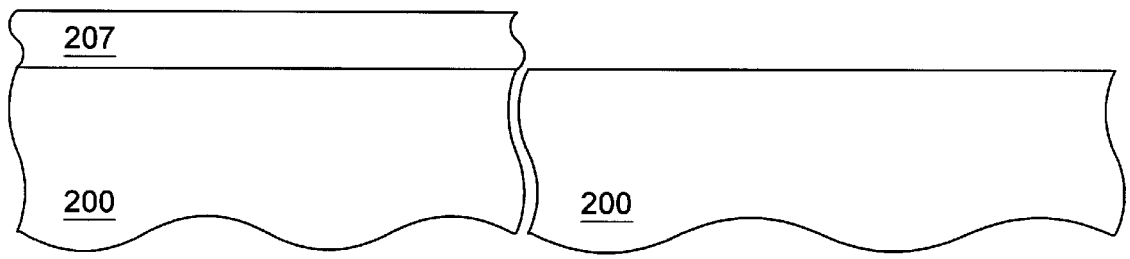
FIG. 3 is a partial cross-sectional view of the semiconductor substrate, in which a masking layer is formed within the memory cell area according to a processing step subsequent to FIG. 2.

To this end, FIGS. 3–5 and FIGS. 6–8 present various embodiments for forming a dielectric layer within memory cell area 202 that is thicker than a dielectric layer within transistor area 204. FIG. 3 depicts a processing step in which masking layer 207 is selectively formed within memory cell area 202. Masking layer 207 is preferably composed of photoresist, and may be formed by spinning on, exposing, and developing photoresist as is known in the art.

Figure 4:
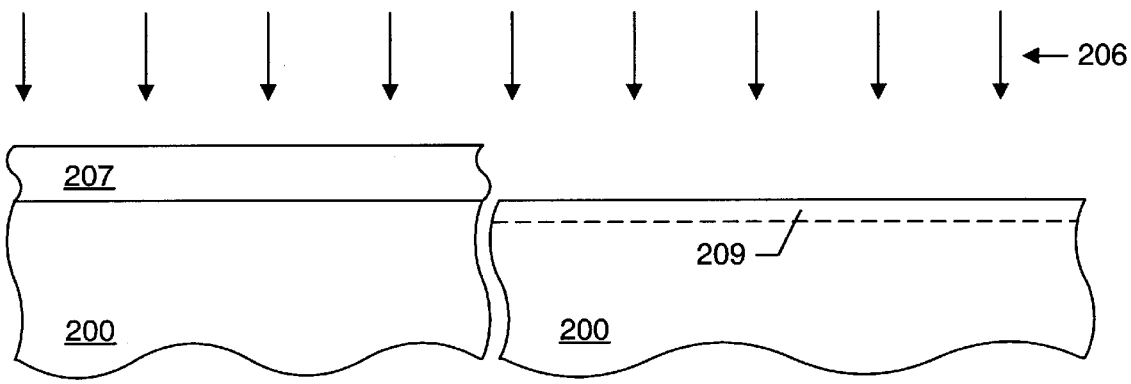
FIG. 4 is a partial cross-sectional view of the semiconductor substrate, in which growth retarding dopants are implanted into the transistor area of the semiconductor substrate according to a processing step subsequent to FIG. 3.

FIG. 4 illustrates a processing step in which growth-retarding dopants 206 are implanted into substrate 200 within transistor area 204. Growth-retarding dopants 206 may be implanted to retard the rate of growth of a dielectric layer in a subsequent processing. Suitable growth-retarding dopants include molecular nitrogen and other nitrogen-bearing species. The implantation of growth-retarding dopants 206 preferably forms growth-retarded region 209 within transistor area 204.

Figure 5:
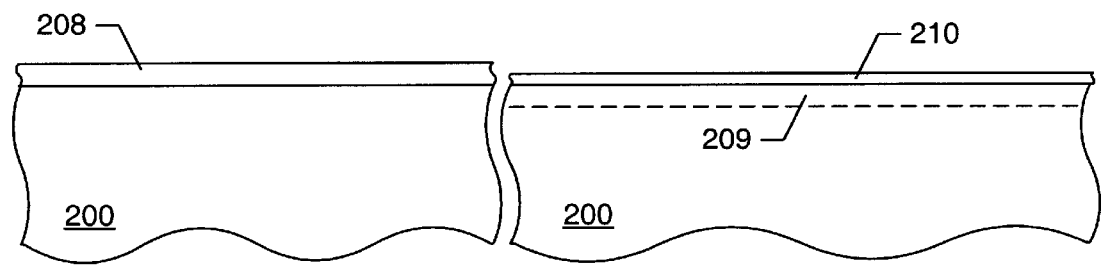
FIG. 5 is a partial cross-sectional view of the semiconductor substrate, in which dielectric layers are grown upon the semiconductor substrate according to a processing step subsequent to FIG. 4.

FIG. 5 shows a processing step in which memory cell dielectric layer 208 is grown within memory cell area 202 and transistor dielectric layer 210 is grown within transistor area 204. Because of the presence of growth-retarding dopants 206 within growth-retarded region 209, transistor area dielectric layer 210 preferably grows at a slower rate than memory cell area dielectric layer 208. After the growth process is complete, memory cell area dielectric layer 208 preferably has an effective capacitance per unit area that is greater than the effective capacitance per unit area of transistor area dielectric layer 210. Preferably, memory cell area dielectric layer 208 has an effective capacitance per unit area equivalent to a silicon dioxide layer about 50–80 angstroms thick. Transistor area dielectric layer 210 preferably has an effective capacitance per unit area equivalent to a silicon dioxide layer about 15–25 angstroms thick. Suitable materials for memory cell area dielectric layer 208 and transistor area dielectric layer 210 include silicon dioxide and silicon oxynitride, as well as various high k value materials such as silicon nitride and certain metal oxides (e.g., tantalum oxide).

Figure 6:
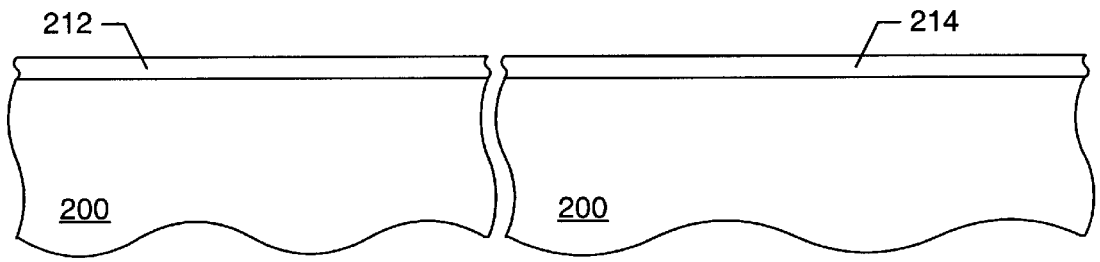
FIG. 6 is a partial cross-sectional view of the semiconductor substrate, in which dielectric layers are grown upon the semiconductor substrate according to a processing step subsequent to FIG. 2.

FIG. 6 depicts a processing step subsequent to FIG. 2 in which memory cell area dielectric layer 212 and transistor area dielectric layer 214 are formed within memory cell area 202 and transistor area 204, respectively. These layers may be deposited or grown. Memory cell dielectric layer 212 and transistor dielectric layer 214 can be composed of materials similar to those of which memory cell area dielectric layer 208 and transistor area dielectric layer 210 can be composed. Both memory cell dielectric layer 212 and transistor dielectric layer 214 are preferably grown to a thickness that gives them an effective capacitance per unit area equivalent to a silicon dioxide layer about 50–80 angstroms thick.

Figure 7:
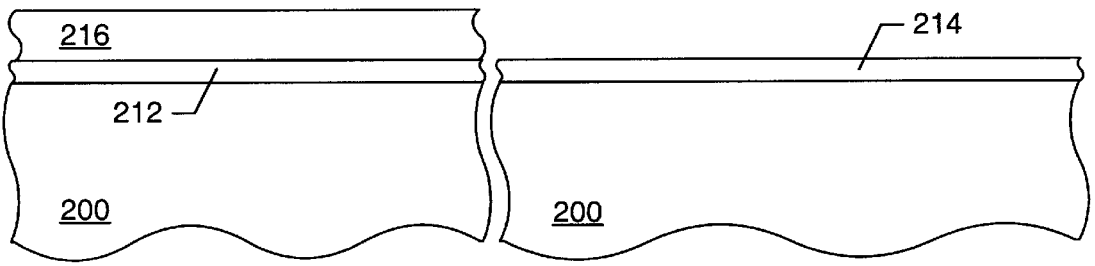
FIG. 7 is a partial cross-sectional view of the substrate, in which a masking layer is formed within the memory cell area according to a processing step subsequent to FIG. 6.

FIG. 7 presents a processing step in which masking layer 216 is selectively formed within the memory cell region of the semiconductor topography. Masking layer 216 is preferably composed of photoresist, and may be formed by spinning on, exposing, and developing photoresist as is known in the art.

Figure 8:
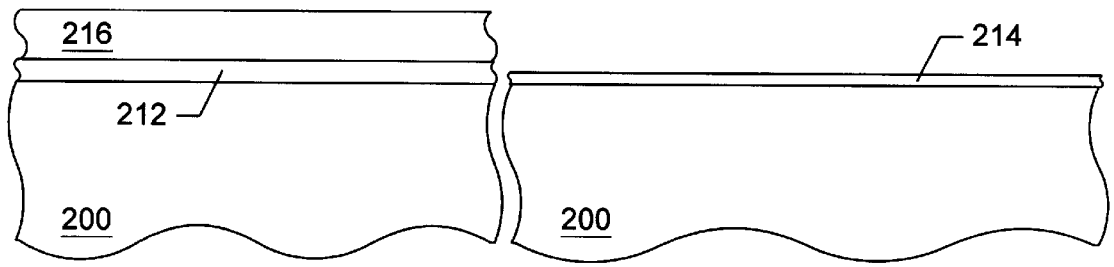
FIG. 8 is a partial cross-sectional view of the substrate, in which the dielectric layer within the transistor area is exposed to an etchant according to a processing step subsequent to FIG. 7.

FIG. 8 illustrates a processing step in which transistor area dielectric layer 214 is exposed to an etchant in an etching process. Both wet and dry etching processes may be used. Etching of transistor area dielectric layer 214 may be used to reduce the thickness of that layer. After etching is complete, transistor area dielectric layer 214 is preferably about 15–25 angstroms thick. Alternately, etching may be used to completely remove transistor dielectric layer 214, and another dielectric layer may be grown to the desired thickness in its place.

Figure 9:
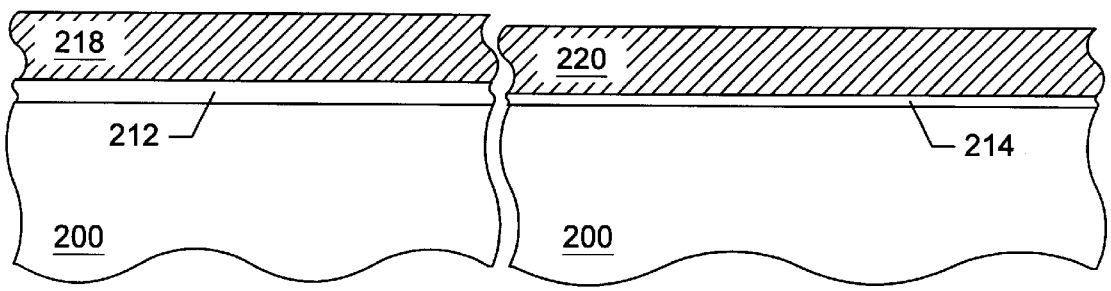
FIG. 9 is a partial cross-sectional view of the substrate, in which conductive layers are formed within the memory cell area and the transistor area according to a processing step subsequent to FIG. 5 or FIG. 8.

FIG. 9 shows a processing step in which memory cell area conductive layer 218 and transistor area conductive layer 220 are formed in memory cell area 202 and transistor area 204, respectively. The processing step depicted in FIG. 9 is illustrated as occurring after the steps depicted in FIGS. 6–8, but the processing step shown in FIG. 9 is not required to use that particular sequence of process steps. For example, the processing step depicted in FIG. 9 could occur after the steps depicted in FIGS. 3–5. Memory cell area conductive layer 218 and transistor area conductive layer 220 are preferably composed of polysilicon, but may be composed of other conductive or potentially conductive materials, such as metals. In an embodiment in which memory cell area conductive layer 218 and transistor area conductive layer 220 are composed of polysilicon, the conductive layers may be formed by depositing polysilicon. Polysilicon to form memory cell area conductive layer 218 and transistor area conductive layer 220 may be deposited using CVD techniques, such as low-pressure chemical vapor deposition ("LPCVD"), from a silane source. Memory cell area conductive layer 218 and transistor area conductive layer 220 may be doped in situ using n- or p-type dopants. Memory cell area conductive layer 218 and transistor area conductive layer 220 are each preferably about 1000–2000 angstroms thick.

Figure 10:
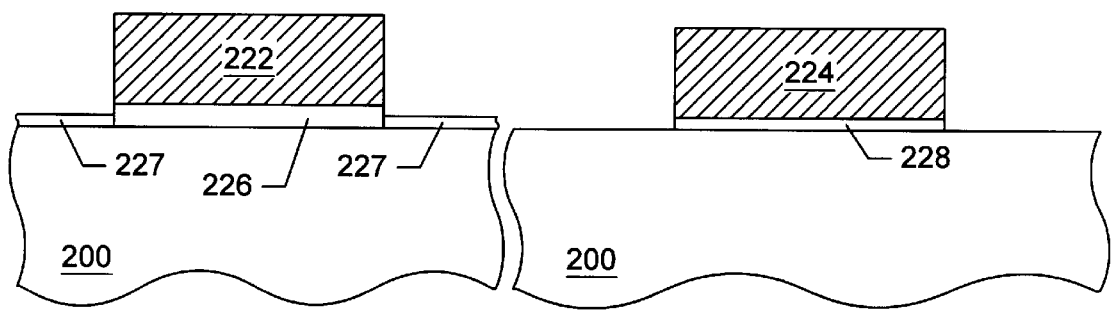
FIG. 10 is a partial cross-sectional view of the substrate, in which a memory cell base gate and a memory cell base gate dielectric are patterned in the memory cell area, and a transistor gate and a transistor gate dielectric are patterned in the transistor area according to a processing step subsequent to FIG. 9.

FIG. 10 depicts a processing step in which memory cell base gate 222 and memory cell base dielectric 226 are patterned from memory cell area conductive layer 218 and memory cell area dielectric layer 212, respectively. This pattering may be performed concurrently with the patterning of transistor gate 224 and transistor gate dielectric 228 from transistor area conductive layer 220 and transistor area dielectric layer 214, respectively. Patterning within each area may be accomplished using optical lithography and plasma etching steps configured for the materials of which each layer is composed. Memory cell base gate dielectric 226 preferably has an effective capacitance per unit area equivalent to a layer of silicon dioxide about 50–80 angstroms thick. Transistor gate dielectric 228 preferably has an effective capacitance per unit area equivalent to a layer of silicon dioxide about 15–25 angstroms thick.

After the above-described patterning is complete, memory cell buffer dielectrics 227 preferably remain upon the surface of semiconductor substrate 200 within memory cell area 202. Because memory cell area dielectric layer 212 is preferably thicker than transistor area dielectric layer 214, an etch process that etches both layers concurrently will tend to remove substantially all of transistor area dielectric layer 214 first. The unetched portions of memory cell area dielectric layer 212 may then be considered memory cell buffer dielectrics 227. Memory cell buffer dielectrics 227 may be formed in other manners as well. For example, a process in which etching is carried out solely in the memory cell area may be terminated before the substrate beneath memory cell area dielectric layer 212 is reached. However formed, memory cell buffer dielectrics 227 preferably each have an effective capacitance per unit area equivalent to a silicon dioxide layer about 35–55 angstroms thick.

Figure 11A:
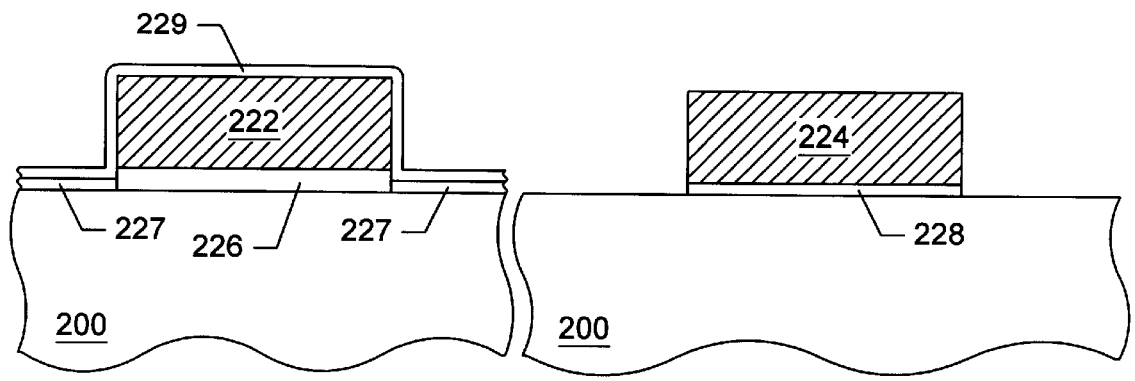
FIG. 11a is a partial cross-sectional view of the substrate, in which an intergate dielectric is selectively formed within the memory cell area upon and around the memory cell base gate according to a processing step subsequent to FIG. 10.

FIG. 11a illustrates a processing step in which memory cell intergate dielectric 229 is selectively formed within memory cell area 202. Selective formation of memory cell intergate dielectric 229 within memory cell area 202 may be undertaken in a variety of ways. For example, dielectric material for the formation of memory cell intergate dielectric 229 may be deposited over substrate 200. This process preferably results in memory cell intergate dielectric 229 being deposited over and around memory cell base gate 229. A masking layer may then be formed within memory cell area 202, and an etching process selective to the materials underlying intergate dielectric 229 can be used to remove intergate dielectric 229 from unmasked areas such as transistor area 204. Deposition of memory cell intergate dielectric 229 can be performed in a single step using a single reaction chamber or in multiple steps using a cluster tool. Suitable materials for memory cell intergate dielectric 229 include silicon dioxide and silicon oxynitride, as well as high k value materials such as silicon nitride and certain metal oxides (e.g., tantalum pentoxide).

Figure 11B:
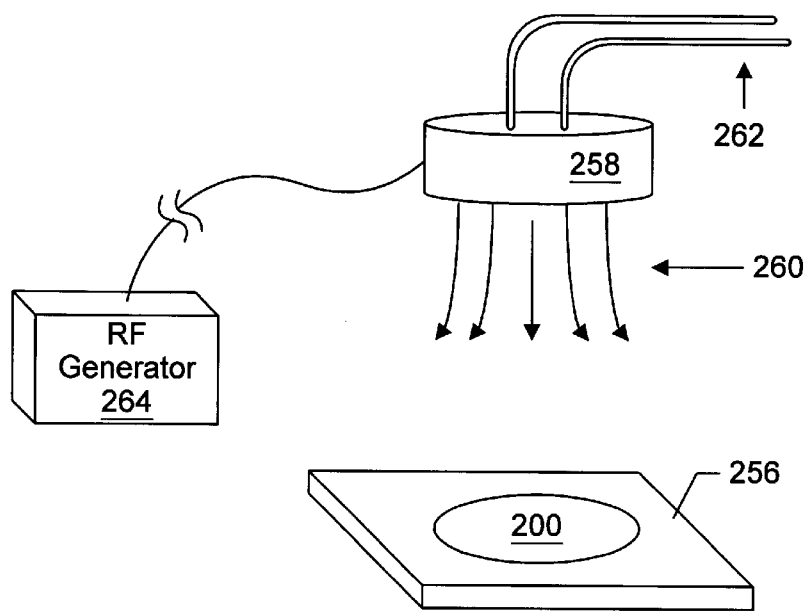
FIG. 11b is a perspective view of an exemplary deposition system (reactor chamber not shown) showing a gas delivery configuration and RF connection layout.

FIG. 11*b* illustrates a potential gas delivery configuration and RF power connection layout for the deposition of memory cell intergate dielectric 229. Substrate 200 may be placed within a reaction chamber (not shown) containing the elements depicted in FIG. 11*b* in either an earlier processing step or immediately before deposition. Substrate 200 is mounted in a substrate mounting position of mounting surface 256, a portion of which is shown in FIG. 11*b*. Showerhead 258 is positioned above substrate 200 such that reactant gases 260 may be flowed over substrate 200. Reactant gases 260 are typically dispersed from showerhead 258 through an array of holes. These reactant gases may be delivered to showerhead 258 through gas lines 262. RF generator 256, which is preferably externally connected to the chamber wall, may be electrically coupled to showerhead 258. The generator may be used during operation to deliver a high frequency RF voltage to the showerhead. The RF voltage can be connected through an electrical matching network. In the event that low frequency RF voltage is used, the voltage may be supplied to a metal portion of substrate mounting surface 256.

In an embodiment, memory cell intergate dielectric 229 may be formed by low-power, low-pressure PECVD using a silicon source gas and a nitrogen source gas at a deposition temperature of about 350–450° C. Such a process preferably results in memory cell intergate dielectric being composed of silicon oxynitride. In a preferred embodiment, the silicon source gas is silane ($SiH_4$) and the nitrogen source gas is nitrous oxide ($N_2O$). The silane is preferably diluted such that the ratio of silane to nitrogen within the dilute silane flow is less than about 1/40 (0.025:1). In an embodiment, the silane flow rate is about 45–55 sccm, the nitrogen flow rate is about 2300–2700 sccm, and the nitrous oxide flow rate is about 5500–6500 sccm. Before application of RF power to the reactor chamber, a "temperature soak", or time delay to allow substrate temperature and other process conditions to stabilize, is performed. This temperature soak is preferably between about 30–60 seconds. About 300–360 W of high frequency power (about 13.56 MHz) may then be applied to the reaction chamber to effect deposition of the intergate dielectric. The power density is preferably at most about 0.15 W/cm$^2$. The pressure within the deposition chamber is preferably less than about 2 torr. These low-power, low-pressure deposition conditions allow for extremely short deposition times. The rate of deposition is preferably about 1 to 2 angstroms of oxynitride per 0.1 seconds. This rate of deposition may be attainable at even shorter time increments, such as 0.05 seconds. Silicon oxynitride deposited in this manner can contain 2–5% nitrogen, but may also contain lesser or greater amounts.

Memory cell intergate dielectric 229 is preferably formed such that it has an effective capacitance per unit area equivalent to a layer of silicon dioxide about 15–30 angstroms thick. High k value materials such as tantalum pentoxide are beneficial in this regard because these materials can be deposited in relatively thick layers and still have an effective capacitance per unit area equivalent to a very thin silicon dioxide layer. Tantalum pentoxide, for example, has a k value of about 24—approximately 6 times that of silicon dioxide. Consequently, a memory cell intergate dielectric composed of tantalum pentoxide layer could be about 90—180 angstroms thick to achieve the desired capacitance. The increased thickness of an intergate dielectric 229 composed of a high k value material may result in fewer of the pinholes and other defects found in very thin silicon dioxide layers.

An oxynitride layer formed in the manner described above, however, may have an effective capacitance per unit area that is the same or only slightly higher than a similarly thick silicon dioxide layer. But in contrast to conventional silicon dioxide deposition techniques, the low-power, low-pressure techniques described above allows for the formation of a silicon oxynitride layer that is extremely thin but also highly reliable. It is believed that a dielectric layer formed in this manner will be considerably more durable than a silicon dioxide layer of the same thickness. In addition, the PECVD technique described above uses lower temperatures than commonly used CVD techniques such as LPCVD. These lower temperatures may beneficially reduce the unwanted diffusion of implanted dopants.

Figure 12:
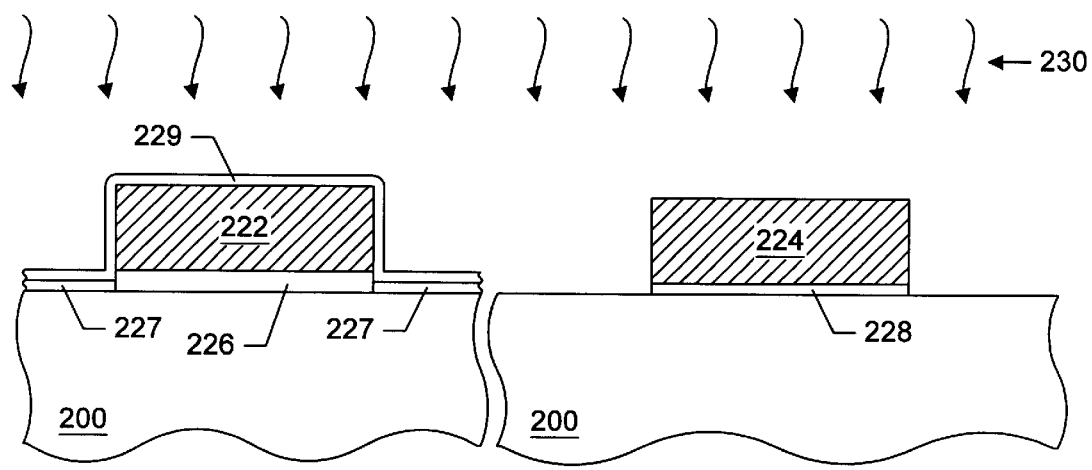

FIG. 12 depicts a processing step in which semiconductor substrate 200 is exposed to thermal radiation 230 in an annealing process. The annealing process may be performed in an Rapid Thermal Annealing ("RTA") chamber or a tube furnace. If a RTA chamber is used, then annealing may be performed at a temperature of about 600–900° C. for approximately 10–30 seconds. Annealing is preferably performed in a nitrogen-bearing ambient, which may contain gases such as molecular nitrogen ($N_2$) or ammonia ($NH_3$). If a more reactive nitrogen-bearing gas, such as ammonia, is used in the ambient during annealing, additional nitrogen may be incorporated into intergate dielectric 229. Incorporation of nitrogen may improve the quality of memory cell intergate dielectric 229 by, for example, reducing the density of interface trap states. Annealing is particularly beneficial if the memory cell intergate dielectric is composed of oxynitride formed in the manner described above. Intergate dielectrics composed of other dielectric materials formed in dissimilar manners may benefit from modifications to or even omission of this annealing step.

Figure 13:
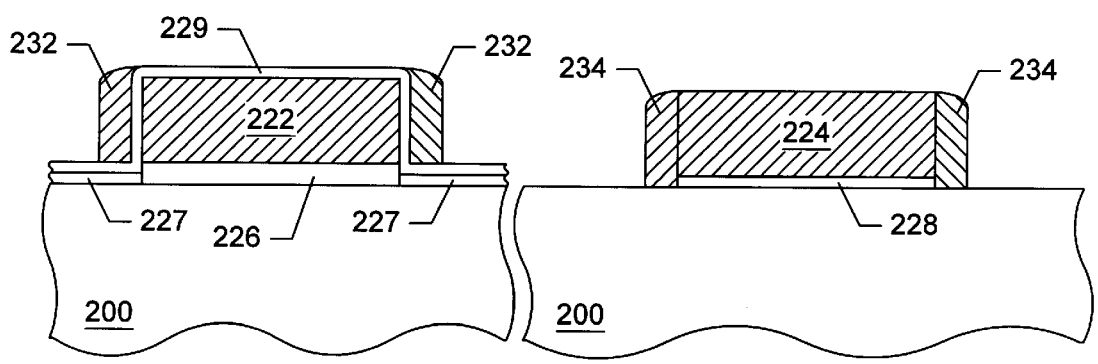
FIG. 13 is a partial cross-sectional view of the substrate, in which a memory cell spacer gate is formed within the memory cell area and transistor spacers are formed within the transistor area according to a processing step subsequent to FIG. 12.

FIG. 13 illustrates a processing step in which memory cell spacer gate 232 is formed within memory cell area 202 and transistor spacers 234 are formed within transistor area 204. Memory cell spacer gate 232 and transistor spacers 234 are preferably formed simultaneously. Formation of these features may be accomplished by first conformally depositing a conductive material over semiconductor substrate 200. Then an anisotropic etch may be performed in which ion ablation occurs more rapidly upon horizontal surfaces than upon vertical surfaces to remove portions of the conductive layer exterior to memory cell spacer gate 232 and transistor spacer 234.

After formation of spacer gate 232 is complete, the spacer gate is preferably in direct contact with memory cell intergate dielectric 229. Spacer gate 232 is preferably 1000–2000 angstroms thick. At least a portion of the spacer gate is elevationally below an upper potion of the base gate. As such, planarization in subsequent processing steps may be made easier because the memory cell does not extend as far above the surrounding topography as conventional memory cells such as the one pictured in FIG. 1.

At least a portion of memory cell intergate dielectric 229 is preferably interposed between a sidewall surface of memory cell spacer gate 232 and memory cell base gate 222. A spacer gate portion of memory cell buffer dielectrics 227 and memory cell intergate dielectric 229 is preferably interposed between the spacer gate and semiconductor substrate 200. These spacer gate portions may have a composite effective capacitance per unit area equivalent to a silicon dioxide layer 50–85 angstroms thick. Any of the conductive materials suitable for base gate 222 may be deposited in the formation of spacer gate 232. However, memory cell spacer gate 232 may be composed of a different material than memory cell base gate 222.

Figure 14:
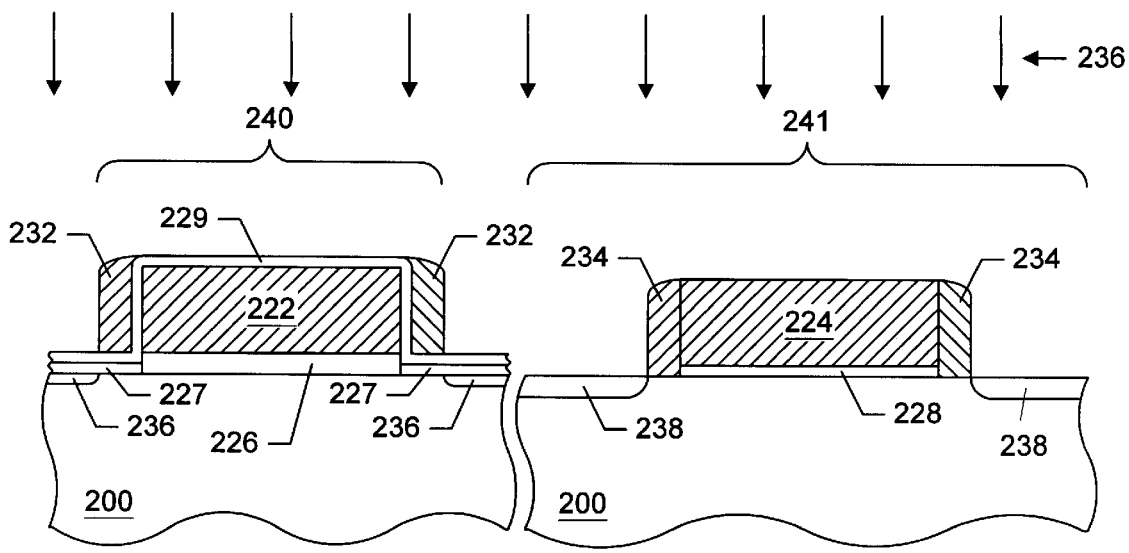
FIG. 14 is a partial cross-sectional view of the substrate, in which dopants are implanted according to a processing step subsequent to FIG. 13.

FIG. 14 presents the implantation of dopants 236, which may be p-type or n-type. Ion implantation of dopants 236 may introduce dopants into memory cell base gate 222 and memory cell spacer gate 232. Introduction of dopants into the memory cell gates is preferably performed if memory cell base gate 222 or memory cell spacer gate 232 are composed of polysilicon; such introduction is not necessary if both of memory cell gates are composed of metals. In addition, if the memory cell gates and transistor gates have been doped in situ, then implantation of dopants into these gates may not be necessary.

The implantation of dopants 236 preferably simultaneously introduces dopants into semiconductor substrate 200 within transistor area 204 to form source/drain regions 238. If implantation is carried out with sufficient implant energy, then implanted regions 236 may form in semiconductor substrate 200 within memory cell area 202. While source/drain junctions 238 preferably are part of transistor 241, implanted regions 236 are preferably incidental to the proper functioning of memory cell 240. Lightly-doped drain ("LDD") regions for transistor 241 may have also been formed in a previous processing step. Alternately, transistor spacers 234 may be removed and an implant step performed to create LDD regions within transistor area 204 in subsequent processing.

While FIGS. 2–14 show embodiments for the formation of memory cell 240 and transistor 241, it should be understood that the above-described techniques for the concurrent fabrication of these devices are presently preferred embodiments. Memory cells such as memory cell 240 and transistors such as transistor 241 are not required to be formed concurrently; processing steps for the fabrication of these devices may be only partially combined or even carried out separately.

Programming and erasure of memory cell 240 may be accomplished in many ways. For example, a positive potential may be applied to memory cell spacer gate 232 while memory cell base gate 222 is grounded. As the voltage rises above a certain level, electrons may begin to tunnel from memory cell base gate 222 through memory cell intergate dielectric 229 to memory cell spacer gate 232. As charge begins to build up on memory cell spacer gate 232, the electric field is reduced and the flow of electrons from memory cell base gate 222 decreases. After the potential is removed from memory cell spacer gate 232, charge may be maintained upon the memory cell spacer gate for a substantial amount of time. Erasure of the memory cell may be carried out by reversing the procedure described above for programming memory cell 240. That is, memory cell spacer gate 232 may be grounded while a positive potential is applied to memory cell base gate 222 until a sufficient amount of charge is drained from the second gate.

Figure 15:
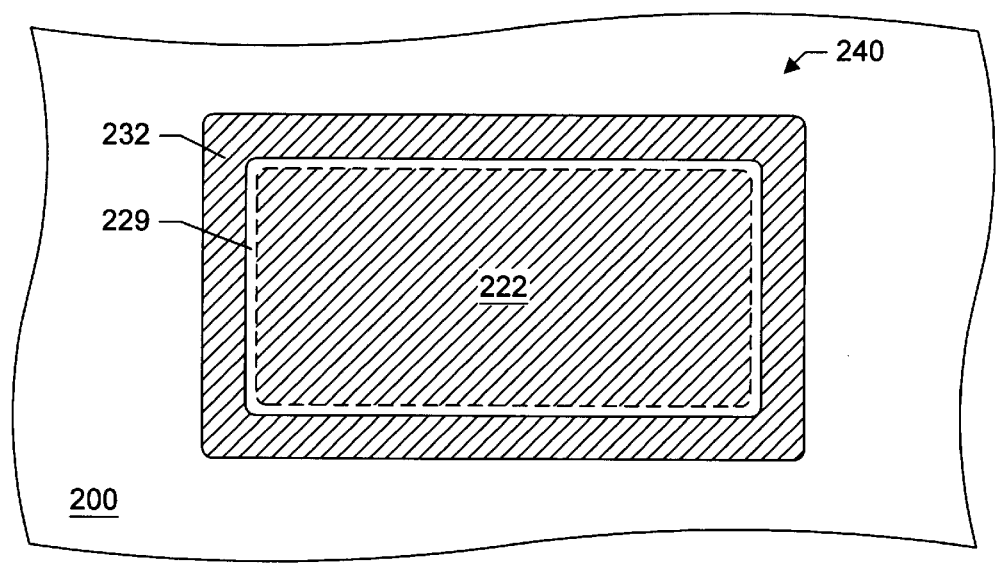
FIG. 15 is a partial top plan view of the substrate, in which the memory cell is shown at a point in time subsequent to FIG. 14.

FIG. 15 presents a partial top plan view of semiconductor substrate 200 at a point in time subsequent to FIG. 14 in which memory cell 240 is shown. Spacer gate 232 preferably surrounds the memory cell base gate 222, and memory cell integrate dielectric 229 is interposed between the two gates.

Figure 16:
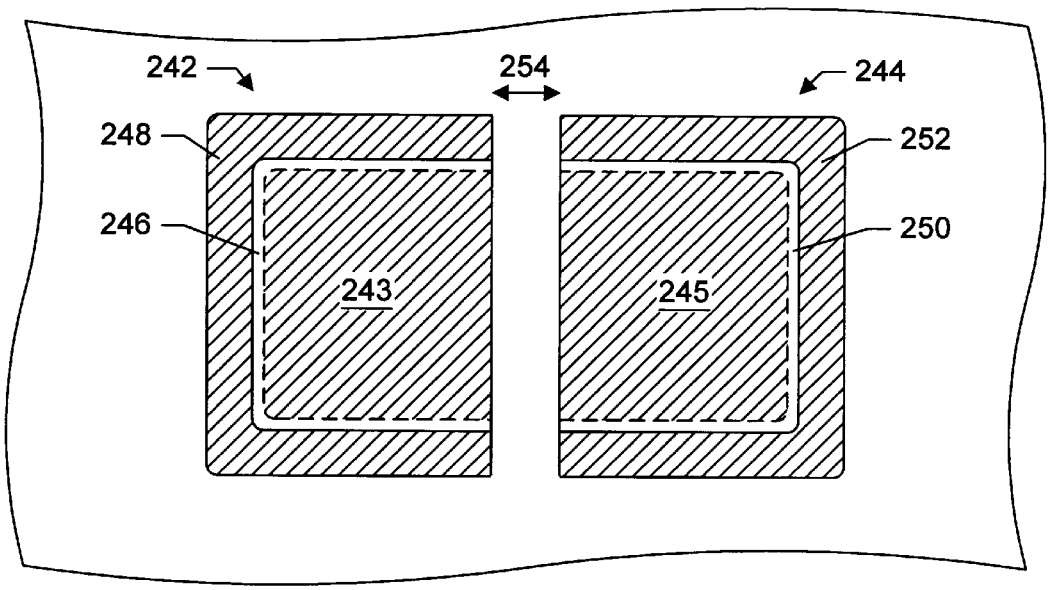
FIG. 16 is a partial top plan view of the substrate, in which the memory cell is divided into a plurality of memory cell divided portions according to a processing step subsequent to FIG. 15.

FIG. 16 shows a partial top plan view of semiconductor substrate 200 in which an etching process is performed on a portion of memory cell 240 to divide the memory cell. The portions of memory cell 240 that are desired to be protected from etching are masked using lithographic techniques, and an anisotropic etch process configured for the materials of which memory cell 240 is composed is performed on the unmasked portions of memory cell 240. Etching is preferably carried out until the substrate is reached, but may be terminated at other points in time after complete separation of the conductive elements of the memory cell. For example, etching may be terminated after memory cell base gate 222 is etched through but before completely etching through memory cell base gate dielectric 226 (not shown).

As a result of the etching process, memory cell 240 is divided into first memory cell divided portion 242 and second memory cell divided portion 244. First memory cell divided portion 242 preferably contains base gate 243, intergate dielectric 246, and spacer gate 248. Likewise, second memory cell divided portion 244 preferably contains base gate 245, intergate dielectric 250, and spacer gate 252. The memory cell divided portions are preferably separated by at least a gap 254. Gap 254 is preferably of sufficient size to allow each memory cell divided portion to independently operate as a memory cell. The memory cell divided portions are preferably capable of functioning in a manner similar to memory cell 240. Dividing memory cell 240 in this manner may thus be used to increase the memory cell density within an integrated circuit. In addition, the memory cell can be divided into three or more closely spaced memory cells by etching more than one line through memory cell 240. Whatever the number of cells memory cell 240 is to be divided into, a memory cell 240 that is to be divided is preferably formed larger than if it was not to be divided to ensure that the memory cells divided portions are large enough to function as desired.

Figure 17:
FIG. 17 is a partial cross-sectional view of a substrate in accordance with another embodiment.

FIGS. 17–26 of the drawings illustrate another embodiment of a process sequence for forming a memory cell. FIG. 17 presents a cross-sectional view of substrate 300. The composition of substrate 300 depends largely on the intended function of the substrate. If devices such as transistors, resistors, or capacitors are to be formed in the substrate plane of substrate 300, then substrate 300 is preferably composed of a semiconducting material. Suitable materials include silicon, silicon germanium, and gallium arsenide. In such an embodiment, substrate 300 may function in a similar manner as semiconductor substrate 200. Alternately, substrate 300 may be primarily intended as a support structure. In such a case, the primary requirement for the material of which the substrate is composed is that the material be compatible with any subsequent processing conditions. For example, the material should not melt in the temperature range in which subsequent steps will be carried out. Suitable materials include semiconducting materials such as those mentioned above, or non-semiconducting materials such as silicon dioxide and various metals.

Figure 18:
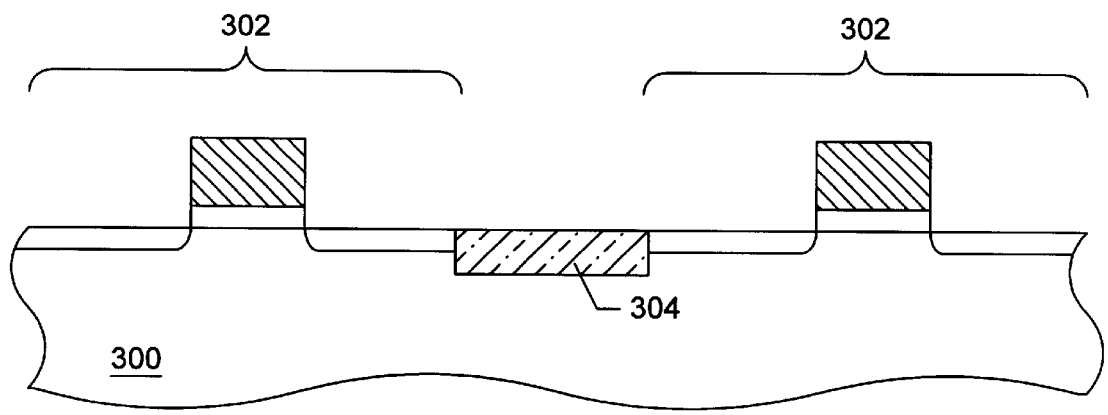
FIG. 18 is a partial cross-sectional view of the substrate, in which active devices are formed in active regions of the substrate adjacent to an isolation region formed in a field region of the substrate according to a processing step subsequent to FIG. 17.

FIG. 18 depicts a processing step in which active devices may be formed in active regions of substrate 300 adjacent to an isolation structure formed in a field region of substrate 300. In the embodiment depicted in FIG. 18, the isolation structure is trench isolation structure 304 and the active devices are MOS transistors 302. In another embodiment, one or more of the active devices may be a memory cell. These memory cells can be similar to previously described memory cell 240. In such a case, any MOS transistors 302 that are formed may also be formed in a similar manner as transistor 241.

Figure 19:
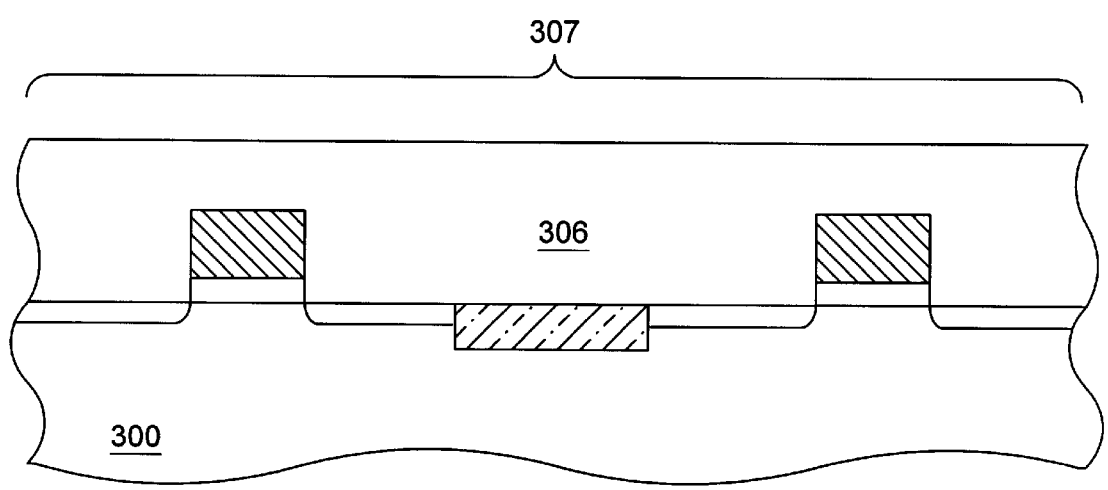
FIG. 19 is a partial cross-sectional view of the substrate, in which a dielectric base layer is formed upon the substrate according to a processing step subsequent to FIG. 18.

FIG. 19 presents a processing step in which a dielectric layer, dielectric base layer 306, is formed. Dielectric base layer 306 is preferably formed by depositing a dielectric material over substrate 300, and then polishing the dielectric material such that the upper surface of dielectric base layer 306 is substantially planar. The preferred material for dielectric base layer 306 is silicon dioxide, but dielectric base layer 306 may be composed of other dielectric materials such as silicon nitride and silicon oxynitride. Memory cell area 307, in which a memory cell will be subsequently formed, is also shown in FIG. 19.

Figure 25:
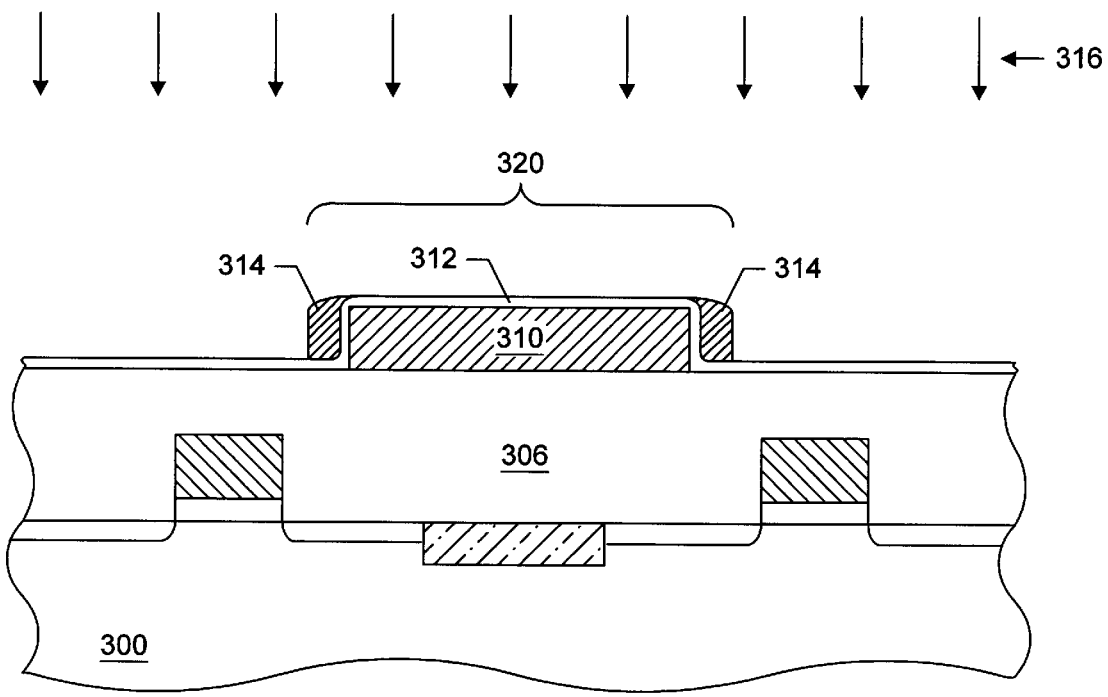
FIG. 25 is a partial cross-sectional view of the substrate, in which dopants are implanted according to a processing step subsequent to FIG. 24.

One purpose of dielectric base layer 306 is to provide electrical insulation between any active devices formed on substrate 300 (e.g., MOS transistors 302), and any devices formed above dielectric base layer 306 (e.g., memory cell 320—see FIG. 25). Therefore, dielectric base layer 306 is preferably configured such that a substantial transfer of electrons through the dielectric base layer, for example by means such as electron tunneling or hot electron injection, does not occur during operation. While dielectric base layer 306 is shown formed above MOS transistors 302 and trench isolation structure 304, it should be understood that substrate 300 may not have any devices formed thereupon. In such an embodiment, substrate 300 would serve primarily as support for dielectric base 306. As stated above, dielectric base layer 306 is preferably formed on a substrate such as substrate 300. If formed upon a substrate, the thickness of dielectric base layer 306 after all formation steps are complete is preferably about 1000–5000 angstroms. In another embodiment, dielectric base layer 306 is not formed upon a substrate but instead serves a substrate itself. Consequently, the thickness of dielectric base layer 306 may be greater than about 100 microns.

Figure 20:
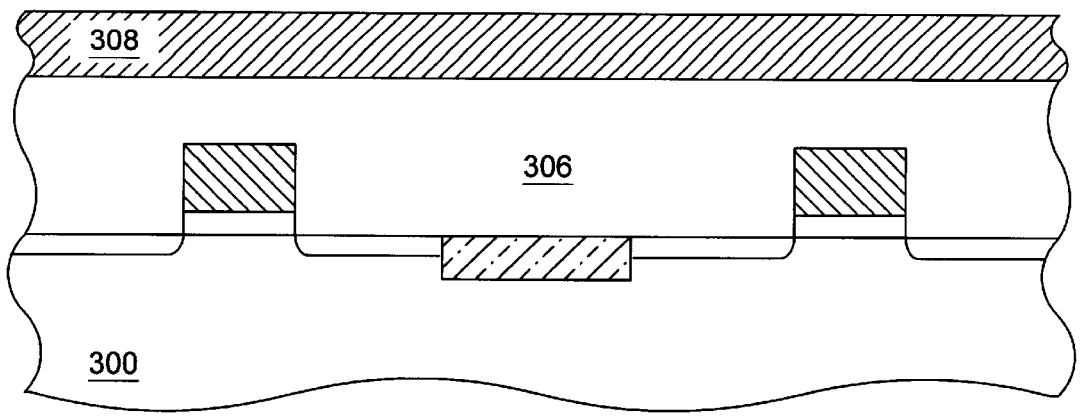
FIG. 20 is a partial cross-sectional view of the substrate, in which a conductive layer is formed upon the dielectric base layer according to a processing step subsequent to FIG. 19.

FIG. 20 illustrate a processing step in which conductive layer 308 is formed upon dielectric base layer 306. Conductive layer 308 is preferably composed of polysilicon, but may be composed of other conductive or potentially conductive materials, such as metals. In an embodiment in which conductive layer 308 is composed of polysilicon, the conductive layer may be formed by depositing polysilicon. Polysilicon to form conductive layer 308 may be deposited using CVD techniques, such as LPCVD, from a silane source. If desired, conductive layer 308 may be doped in situ using n- or p-type dopants. Conductive layer 308 is preferably about 1000–2000 angstroms thick.

Figure 21:
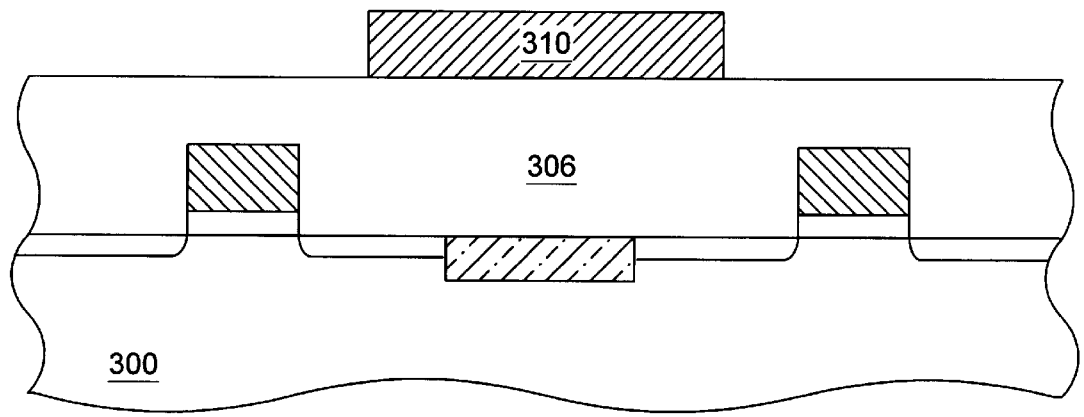
FIG. 21 is a partial cross-sectional view of the substrate, in which a memory cell base gate is patterned from the conductive layer according to a processing step subsequent to FIG. 20.

FIG. 21 depicts a processing step in conductive layer 308 is patterned to form memory cell base gate 310. Patterning of conductive layer 308 may occur in an anisotropic etch process that is selective to the underlying dielectric base layer. Memory cell base gate 310 may function similarly to memory cell base gate 222.

In an alternate embodiment, a thin dielectric layer may be formed upon the dielectric base layer before formation of conductive layer 308. This layer can be patterned to form a base gate dielectric similar to base gate dielectric 226 described previously. But since dielectric base layer 306 preferably provides electrical separation from any devices formed on the substrate, the formation of a base gate dielectric is not required.

Figure 22:
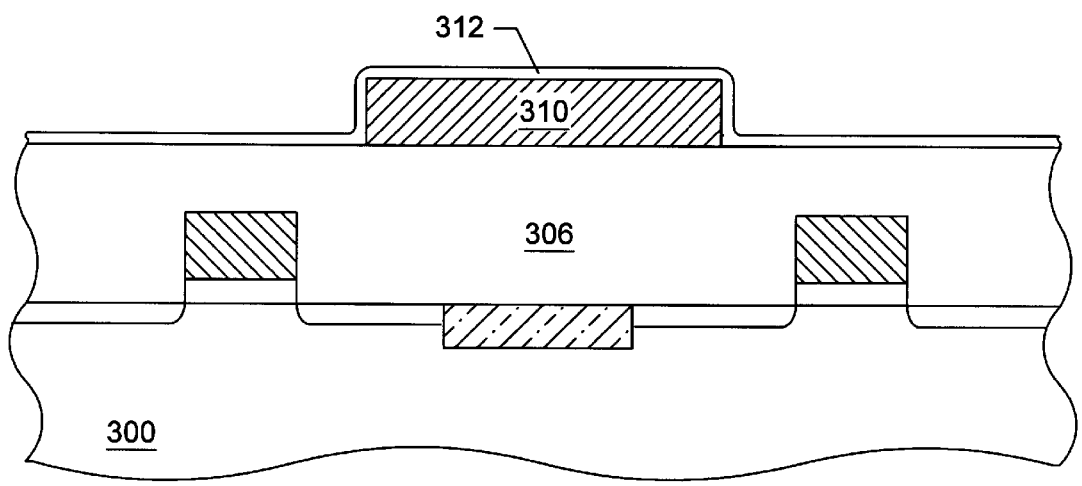
FIG. 22 is a partial cross-sectional view of the substrate, in which an intergate dielectric is formed over and around the base gate according to a processing step subsequent to FIG. 21.

FIG. 22 depicts a processing step in which intergate dielectric 312 is formed over and around base gate 310. Intergate dielectric material may be composed of similar materials as memory cell intergate dielectric 229, and can be formed using similar techniques. Intergate dielectric is preferably formed such that it has an effective capacitance per unit area equivalent to a silicon dioxide layer about 15–30 angstroms thick.

Figure 23:
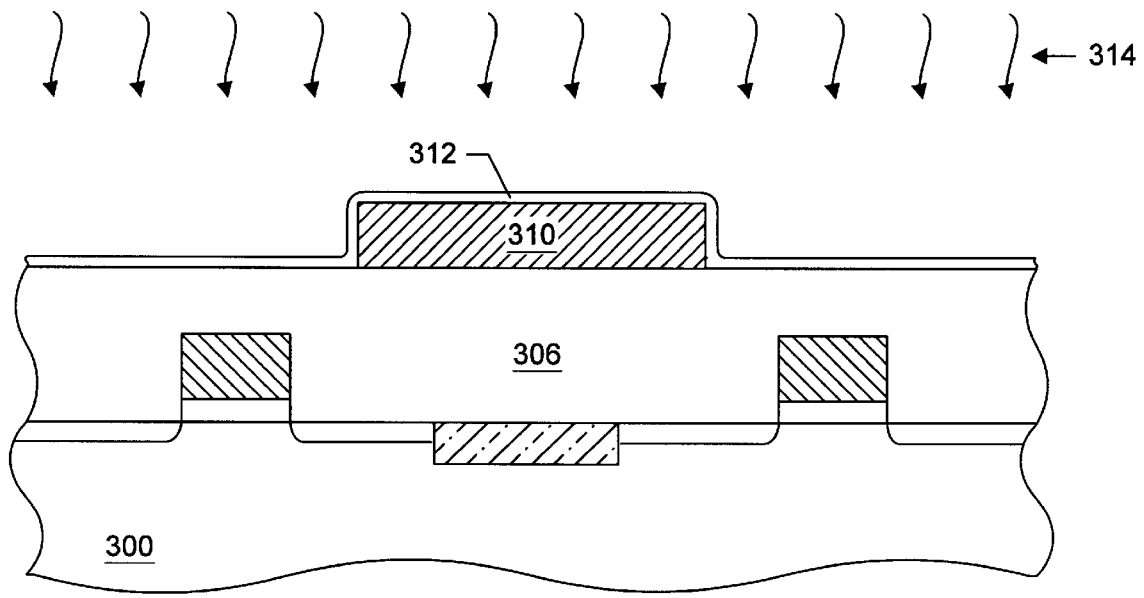
FIG. 23 is a partial cross-sectional view of the substrate, in which the intergate dielectric layer is exposed to thermal radiation according to a processing step subsequent to FIG. 22.

FIG. 23 illustrates a processing step in which substrate 300 is exposed to thermal radiation 314 in an annealing process. The annealing process may be performed similarly to the annealing process described in regard to FIG. 12.

Figure 24:
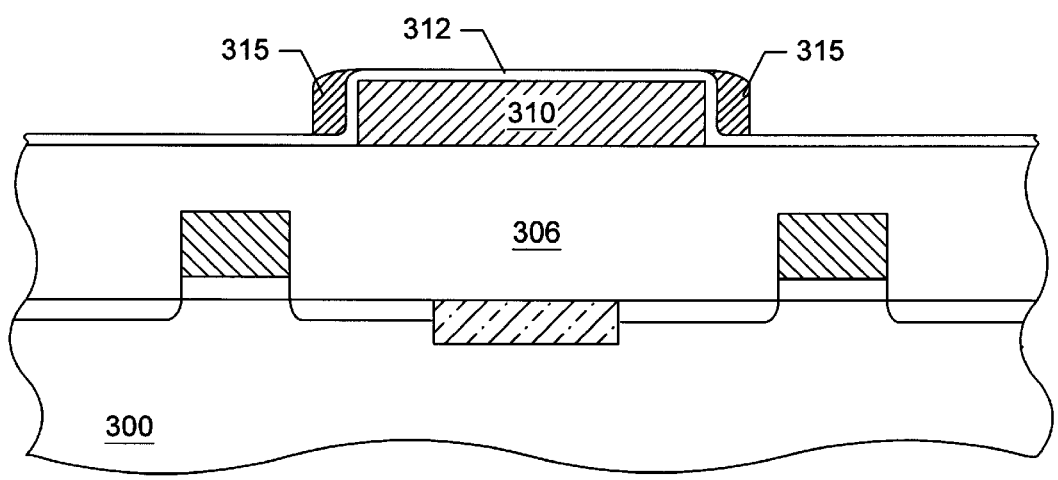
FIG. 24 is a partial cross-sectional view of the substrate, in a spacer gate is formed according to a processing step subsequent to FIG. 23.

FIG. 24 depicts a processing step in which spacer gate 315 is formed. Spacer gate 315 may function similarly to spacer gate 232 and can be formed using similar techniques. After formation, spacer gate 315 is preferably about 1000–2000 angstroms thick. Spacer gate 315 is may be arranged upon intergate dielectric 312. At least a portion of spacer gate 315 is preferably arranged elevationally below an upper portion of base gate 310. Intergate dielectric 312 is at least partially interposed between spacer gate 315 and base gate 310.

FIG. 25 depicts a processing step in which dopants 316 are implanted. Dopants 316 may be n-type or p-type. Ion implantation of dopants 316 may introduce the dopants into spacer gate 314 and base gate 310. Introduction of dopants 316 into the gates of memory cell 320 preferably occurs if either of the gates is composed of polysilicon; such dopant introduction is not necessary if both of the memory cell gates are composed of metals. In addition, if the memory cell gates and transistor gates have been doped in situ, then implantation of dopants into these gates may not be necessary. Memory cell 320 as shown in FIG. 25 may function similarly to memory cell 240. Additionally, memory cell 320 can be divided into a plurality of memory cell divided portions like memory cell 240.

Figure 26:
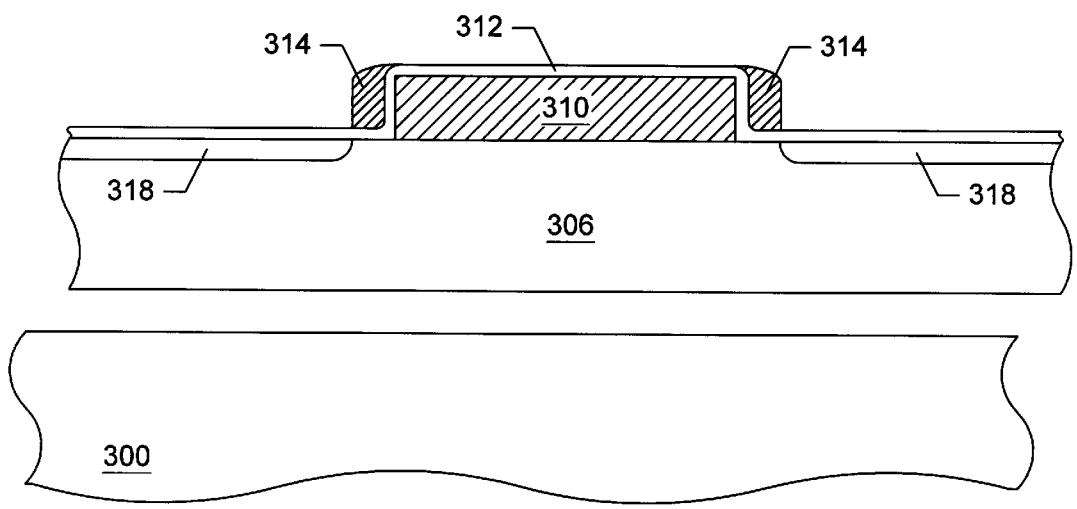
FIG. 26 is a partial cross-sectional view of the substrate, in which the dielectric base layer is separated from the substrate according to a processing step subsequent to FIG. 25.

As an option, dielectric base layer 306 may subsequently be separated from substrate 300 (see FIG. 26). Such separation may occur at any point in the overall fabrication process after the formation of memory cell 320. After separation, a portion of dielectric base 306 may remain upon substrate 300. If this separation is performed, it is preferable that no devices are formed on substrate 300 in prior processing.

It will be appreciated to those skilled in the art having the benefit of this disclosure that this invention is believed to provide a method for fabricating an integrated circuit containing an improved memory cell, and an integrated circuit containing such a memory cell. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit, comprising:
   a substrate;
   a dielectric layer;
   a transistor arranged within and upon an active region of said substrate below said dielectric layer; and
   a memory cell at least partially arranged on said dielectric layer and comprising:
   a memory cell base gate arranged above said dielectric layer;

a memory cell intergate dielectric arranged over and around said memory cell base gate; and a memory cell spacer gate arranged such that at least a portion of said memory cell spacer gate is elevationally below an upper portion of said memory cell base gate, and wherein at least a portion of said memory cell intergate dielectric is interposed between a sidewall surface of said memory cell base gate and a sidewall surface of said memory cell spacer gate.

2. The integrated circuit of claim 1, wherein said dielectric layer serves as a dielectric base layer that is sufficiently thick to electrically separate said transistor and said memory cell.

3. The integrated circuit of claim 1, wherein said transistor comprises a transistor gate arranged upon a transistor gate dielectric.

4. The integrated circuit of claim 1, wherein said memory cell spacer gate comprises a conductive material, and wherein said transistor comprises transistor spacers, and wherein said transistor also comprises said conductive material.

5. The integrated circuit of claim 1, wherein said memory cell further comprises a memory cell base gate dielectric.

6. The integrated circuit of claim 5, wherein said memory cell base gate dielectric comprises a capacitance per unit area equivalent to a silicon dioxide layer about 50–80 angstroms thick.

7. The integrated circuit of claim 5, wherein said memory cell gate dielectric comprises a material with a permittivity value greater than 4.0.

8. The integrated circuit of claim 5, wherein said memory cell base gate dielectric comprises tantalum oxide.

9. The integrated circuit of claim 1, wherein said memory cell intergate dielectric comprises a capacitance per unit area equivalent to a silicon dioxide layer about 15–30 angstroms thick.

10. The integrated circuit of claim 1, wherein said memory cell intergate dielectric comprises a material with a permittivity value greater than 4.0.

11. The integrated circuit of claim 1, wherein said memory cell intergate dielectric comprises silicon oxynitride.

12. The integrated circuit of claim 1, wherein said memory cell is dividable into a plurality of memory cell divided portions, and wherein each of said plurality of memory cell divided portions is separated by at least a gap, and wherein said gap is sufficiently large to allow each of said plurality of divided memory cell portions to independently function as a memory cell.

13. The integrated circuit of claim 1, wherein said dielectric layer is about 1000–3000 angstroms thick.

14. The integrated circuit of claim 1, further comprising an interposed memory cell arranged within and upon active regions of the substrate below said dielectric layer.

15. An integrated circuit, comprising:

a substrate comprising a non-semiconducting material;

a dielectric layer arranged upon said substrate; and a memory cell at least partially arranged on said dielectric layer and comprising:

a memory cell base gate arranged above said dielectric layer;

a memory cell intergate dielectric arranged over and around said memory cell base gate; and a memory cell spacer gate arranged such that at least a portion of said memory cell spacer gate is elevationally below an upper portion of said memory cell base gate, and wherein at least a portion of said memory cell intergate dielectric is interposed between a sidewall surface of said memory cell base gate and a sidewall surface of said memory cell spacer gate.

16. The integrated circuit of claim 15, wherein said memory cell base gate comprises polysilicon.

17. The integrated circuit of claim 15, wherein said memory cell base gate comprises metal.

18. An integrated circuit, comprising:

a dielectric layer, wherein said dielectric layer serves as a substrate; and a memory cell at least partially arranged on said dielectric layer and comprising:

a memory cell base gate arranged above said dielectric layer;

a memory cell intergate dielectric arranged over and around said memory cell base gate; and a memory cell spacer gate arranged such that at least a portion of said memory cell spacer gate is elevationally below an upper portion of said memory cell base gate, and wherein at least a portion of said memory cell intergate dielectric is interposed between a sidewall surface of said memory cell base gate and a sidewall surface of said memory cell spacer gate.

19. The integrated circuit of claim 18, further comprising source and drain regions formed within said dielectric layer and laterally adjacent said memory cell.

\* \* \* \* \*